(12) United States Patent
Lee et al.

(10) Patent No.: US 9,887,225 B2
(45) Date of Patent: Feb. 6, 2018

(54) PIXEL WITH SPACER LAYER COVERING PHOTODIODE

(71) Applicant: TAIWAN SEMICONDUCTOR MANUFACTURING CO., LTD., Hsinchu (TW)

(72) Inventors: Kuo-Hung Lee, Taipei (TW); Chia-Pin Cheng, Kaohsiung (TW); Fu-Cheng Chang, Tainan (TW); Volume Chien, Tainan (TW); Ching-Hung Kao, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/228,071

(22) Filed: Aug. 4, 2016

(65) Prior Publication Data

US 2017/0345852 A1    Nov. 30, 2017

Related U.S. Application Data

(60) Provisional application No. 62/342,223, filed on May 27, 2016.

(51) Int. Cl.
*H01L 31/18* (2006.01)
*H01L 27/146* (2006.01)

(52) U.S. Cl.
CPC .... *H01L 27/1463* (2013.01); *H01L 27/14614* (2013.01); *H01L 27/14636* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 2005/0059177 A1* | 3/2005 | Rhodes | H01L 27/14609 438/22 |
| 2006/0205137 A1* | 9/2006 | Hong | H01L 27/0629 438/211 |
| 2008/0179640 A1* | 7/2008 | Chuang | H01L 27/14689 257/292 |
| 2009/0141159 A1* | 6/2009 | Choi | H01L 27/14603 348/311 |
| 2015/0076566 A1* | 3/2015 | Kamino | H01L 27/14614 257/229 |
| 2016/0163758 A1* | 6/2016 | Iwasaki | H01L 27/14643 257/225 |
| 2017/0062497 A1* | 3/2017 | Goto | H01L 27/1463 |

* cited by examiner

*Primary Examiner* — Thao P Le
(74) *Attorney, Agent, or Firm* — McClure, Qualey & Rodack, LLP

(57) ABSTRACT

A semiconductor device is provided. The semiconductor device includes a semiconductor substrate. An isolation feature is disposed in the semiconductor substrate to define a pixel region and a periphery region of the semiconductor substrate. A transistor gate is formed on the semiconductor substrate in the pixel region, in which the transistor gate has a first sidewall and a second sidewall opposite to the first sidewall. A photodiode is disposed in the semiconductor substrate and adjacent to the second sidewall of the transistor gate. A patterned spacer layer is formed on the photodiode and on the transistor gate. The patterned spacer layer includes a first sidewall spacer on the first sidewall of the transistor gate, and a protective structure covering the photodiode and a top surface of the transistor gate.

20 Claims, 9 Drawing Sheets

PIXEL WITH SPACER LAYER COVERING PHOTODIODE

This application claims priority to U.S. Provisional Application Ser. No. 62/342,223, filed May 27, 2016, which is herein incorporated by reference.

BACKGROUND

Complementary Metal-Oxide-Semiconductor (CMOS) image sensors (CIS) are used in numerous applications including digital still cameras. In semiconductor technologies, image sensors are used for sensing exposed lights projected towards a semiconductor substrate. Generally, CIS products include a pixel (or pixel array) region and a periphery region. These products utilize an array of active pixels (i.e., image sensor elements or cells) including photodiodes and other elements (e.g., transistors) to convert images into digital data or electrical signals. Each of the photodiodes includes a p-type pinned photodiode and a n-type pinned photodiode to form a P-N junction for transforming photons into electrons. Dark current (DC) and white pixel (WP) performance of the photodiodes are affected by various factors.

BRIEF DESCRIPTION OF THE DRAWINGS

For a more complete understanding of the present embodiments, and the advantages thereof, reference is now made to the following descriptions taken in conjunction with the accompanying drawings.

DETAILED DESCRIPTION

Figure 1:
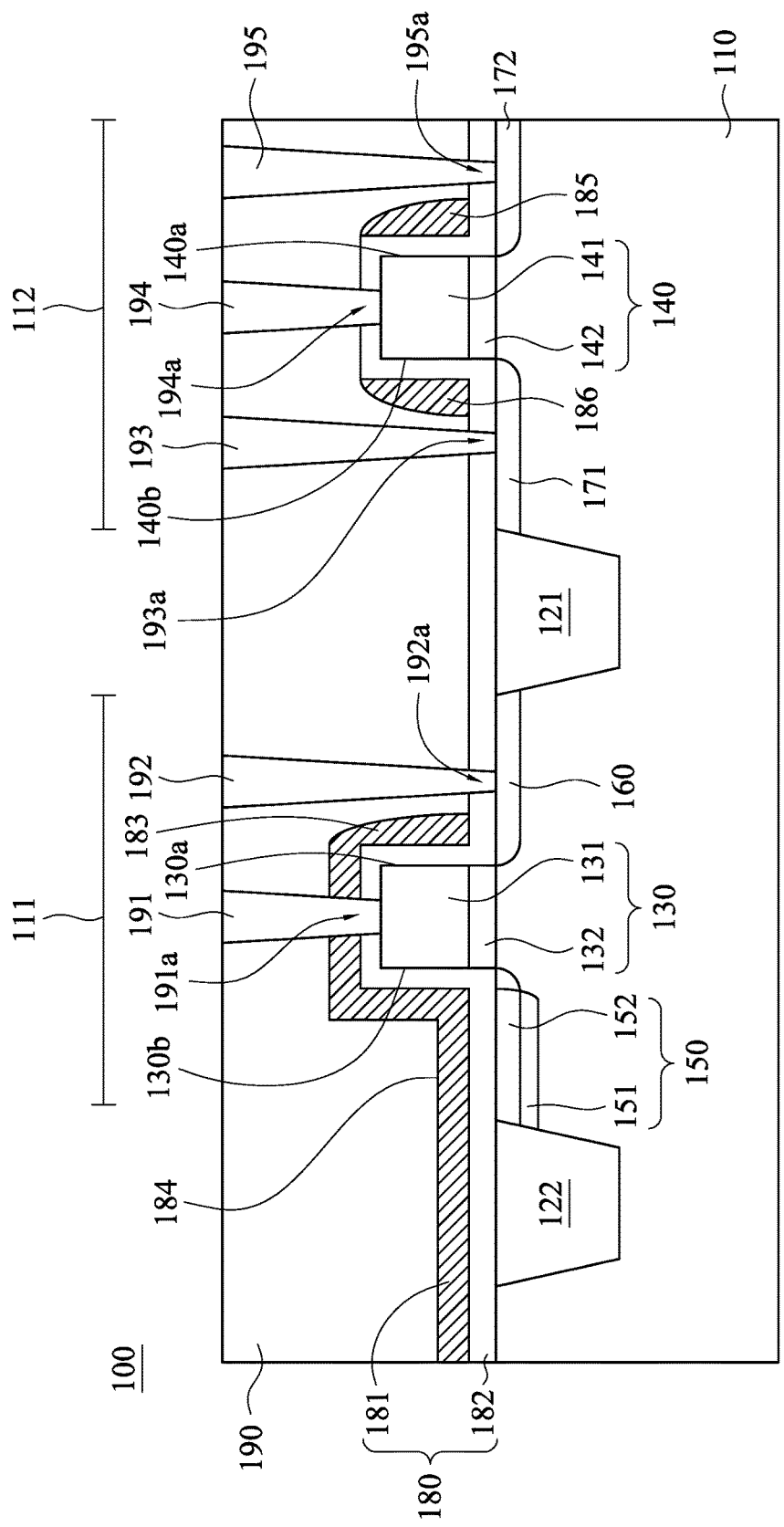
FIG. 1 is a schematic cross-sectional diagram of showing a semiconductor device 100 in accordance with some embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

In general, various processes, such as implantation and etching, are performed after a photodiode is formed, and these process may damage the photodiode. Therefore, a protective layer may be formed on the photodiode to protect the photodiode from being damaged by the processes. For example, a silicon nitride layer may be formed on a surface of the photodiode, and a silicon oxide layer is formed on the silicon nitride layer. A sidewall spacer is formed by etching the silicon oxide layer using an anisotropic etching process. When the silicon oxide layer is etched, the silicon nitride layer may be consumed and become thinner. This will reduce Si protection ability of the silicon nitride layer and makes WP/DC performance worse.

In view of the above, embodiments of the present disclosure provide a semiconductor device for a CIS device to sense light emitted to the front or back side of the CIS device. In the semiconductor device, a spacer layer is formed on the photodiode and on a transistor gate. The spacer layer is etched to form a sidewall space on a sidewall of the transistor gate. However, the portion of the spacer layer on the photodiode is not etched to form a protective structure covering the photodiode.

FIG. 1 is a schematic cross-sectional diagram of showing a semiconductor device 100 in accordance with some embodiments. As shown in FIG. 1, a semiconductor device 100 comprises a semiconductor substrate 110. In some embodiments, the semiconductor substrate 110 is formed from silicon. Other commonly used materials, such as carbon, germanium, silicon-germanium, gallium, arsenic, nitrogen, indium, phosphorus, and/or the like, may also be included in the semiconductor substrate. The semiconductor substrate 110 may be formed from a single-crystalline semiconductor material or compound semiconductor materials, and may be a bulk substrate or a semiconductor-on-insulator (SOI) substrate.

The semiconductor device 100 also includes an isolation feature 121 and an isolation feature 122. Note that the semiconductor device 100 may include more isolation features, and not all of them are illustrated. The isolation feature 121 is disposed in the semiconductor substrate 110 to define a pixel region 111 and a periphery region 112 of the semiconductor substrate 110. In some embodiments, the isolation features 121 and 122 include material such as silicon oxide, a trench isolation, silicon dioxide or field oxide (FOX). In some embodiments, the isolation features 121 and 122 may be shallow trench isolations (STIs) used to separate and isolate photo diodes, memory cells or SRAM cells in an array area. Some of the isolation features 121 and 122 may be deep trench isolations used to separate and isolate NMOS and PMOS devices in the periphery region 112, and some of the isolation features 121 and 122 may be junction isolations to isolate active elements. The structures, materials, depth of the STI and the deep trench isolations can be different in different areas. Specific STI profile and material may be needed for meeting certain device requirements.

A transistor gate 130 (such as a transfer transistor or a reset transistor) is disposed on the semiconductor substrate 110 in the pixel region 111. A gate structure 140 is disposed on the semiconductor substrate 110 in the periphery region 112. In some embodiments, the transistor gate 130 includes a poly-silicon gate 131 and a dielectric layer 132, and the gate structure 140 includes a poly-silicon gate 141 and a dielectric layer 142. Therefore, the poly-silicon gates 131 and 141 may be formed in the same operation, and it is similar to the operation of forming the dielectric layers 132 and 142. In some embodiments, the dielectric layers 132 and 142, such as silicon dioxide, are thermally grown to a thickness between about 10 Å to about 150 Å. The poly-silicon gates 131 and 141 are next deposited via low pressure chemical vapor deposition (LPCVD) process, procedures to a thickness in a range from about 1000 Å to about 3000 Å. The poly-silicon gates 131 and 141 can be doped in situ, during deposition, via the addition of arsine, or phosphine, to a silane ambient, or the poly-silicon gates 131 and 141 can be deposited intrinsically, and subsequently doped via implantation of arsenic or phosphorous ions. The transistor gate 130 has a first sidewall 130a and a second sidewall 130b opposite to the first sidewall 130a. The gate structure 140 has a first sidewall 140a and a second sidewall 140b opposite to the first sidewall 140a.

A photodiode 150 is disposed in the semiconductor substrate 110 and is adjacent to the second sidewall 130b of the transistor gate 130 and is adjacent to the isolation feature 122. The photodiode includes a first pinned photodiode (PPD) 151 with a first dopant type and a second PPD 152 with a second dopant type. The second dopant type is different from the first dopant type. In some embodiments, the first PPD 151, such as an n-type pinned photodiode (NPPD), is first formed in the semiconductor substrate 110 (such as a p-type semiconductor substrate) by implanting n-type doping ions (such as phosphorus or arsenic) into the semiconductor substrate 110. Then, the second PPD 152, such as a p-type pinned photodiode (PPPD), is formed and embedded in the NPPD 151 by implanting p-type doping ions (such boron or gallium) into in a portion of the NPPD 151. Therefore, the NPPD and PPPD may form a P-N junction for transforming photons into electrons.

A first-type drain region 160 is formed in the pixel region 111, and a first-type source region 171 and a first-type drain region 172 are formed in the periphery region 112 by doping first-type ions into the pixel region 111 and the periphery region 112. The transistor gate 130 is between the photodiode 150 and the first-type drain region 160. The gate structure 140 is between the first-type source region 171 and the first-type drain region 172. In some embodiments, second-type ions may be doped into the periphery region 112 to form a second-type source/drain region.

A patterned spacer layer 180 is formed on the photodiode 150 and on the transistor gate 130 by using a rapid process oxidation process, a LPCVD or a plasma enhanced chemical vapor deposition (PECVD) process. The patterned spacer layer 180 includes a sidewall spacer 183 on the first sidewall 130a of the transistor gate 130, and a protective structure 184 covering the photodiode 150 and a top surface of the transistor gate 130. The patterned spacer layer 180 also includes a sidewall spacer 185 on the first sidewall 140a of the gate structure 140, and a sidewall spacer 186 on the second sidewall 140b of the gate structure 140. In the embodiment, the patterned spacer layer 180 includes a silicon nitride layer 182 and a silicon dioxide layer 181, in which the silicon nitride layer 182 is disposed between the silicon dioxide layer 181 and the semiconductor substrate 110. The silicon nitride layer 182 covers the isolation feature 121, the photodiode 150, the transistor gate 130, the first-type drain region 160, the isolation feature 122, the first-type source region 171, the gate structure 140, and the first-type drain region 172. The silicon dioxide layer 181 forms the protective structure 184, the sidewall spacers 183, 186 and 185. Because the protective structure 184 covers the photodiode 150, the photodiode 150 is prevented from being damaged by subsequent processes after the photodiode 150 is formed. In other embodiments, the patterned spacer layer 180 may include a nitride-oxide-nitride layer or other suitable dielectric layer.

The patterned spacer layer 180 has openings 191a-195a corresponding to the transistor gate 130, the first-type drain region 160, the first-type source region 171, the gate structure 140 and the first-type drain region 172 respectively. The opening 191a is surrounded by a remaining portion of the patterned spacer layer 180. An inter layer dielectric (ILD) layer 190, such as formed from silicon oxide or borophosphosilicate glass (BPSG), is deposited to have a thickness in a range from about 300 nm to about 1300 nm using such as a low pressure chemical vapor deposition (LPCVD) process or a plasma enhanced chemical vapor deposition (PECVD) process. Then, a chemical mechanical polishing (CMP) procedure is used for planarization, thereby creating a smooth top surface topography for the ILD layer. Photolithographic and RIE processes, such as using $CHF_3$ as an etchant, may be used to form contact holes in the ILD layer 190. Then, a metal material, such as formed from tungsten, aluminum, or copper, fills the contact holes to form the contact structures 191-195 which are electrically connected to the transistor gate 130, the first-type drain region 160, the first-type source region 171, the gate structure 140 and the first-type drain region 172 through the openings 191a-195a, respectively.

In some embodiments, the semiconductor substrate 110 is a p-type substrate, and the first-type and the second-type may be n-type and p-type respectively. In alternative embodiments, the first-type and the second-type may be p-type and n-type respectively.

Figure 2A:
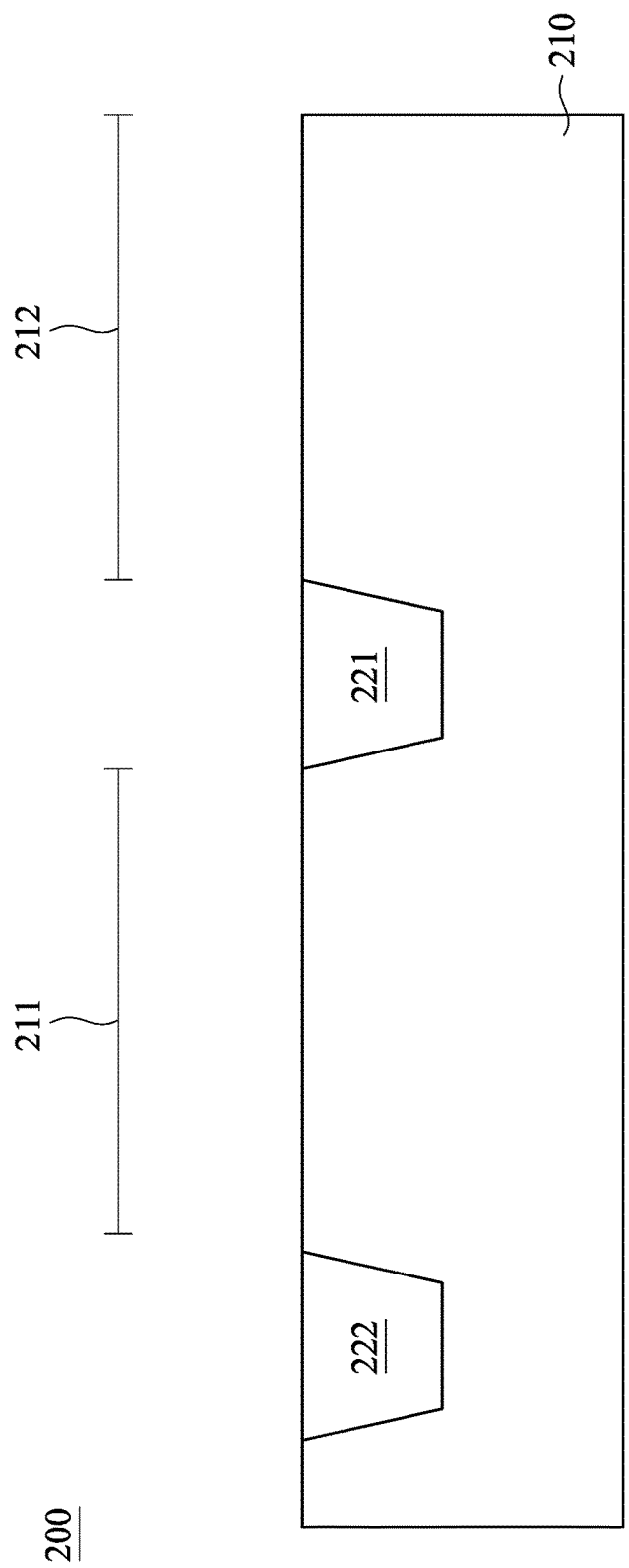
FIG. 2A to FIG. 2F are diagrams illustrating cross-sectional views of intermediate stages showing a method for fabricating a semiconductor device 200 according to some embodiments.

FIG. 2A to FIG. 2F are diagrams illustrating cross-sectional views of intermediate stages showing a method for fabricating a semiconductor device 200 according to some embodiments. Referring to FIG. 2A, a semiconductor substrate 210 is provided. In some embodiments, the semiconductor substrate 210 is formed from silicon. Other commonly used materials, such as carbon, germanium, silicon-germanium, gallium, arsenic, nitrogen, indium, phosphorus, and/or the like, may also be included in the semiconductor substrate. The semiconductor substrate 210 may be formed from a single-crystalline semiconductor material or compound semiconductor materials, and may be a bulk substrate or a semiconductor-on-insulator (SOI) substrate.

Isolation features 221 and 222 are formed in the semiconductor substrate 210. Note that the semiconductor device 200 may include more isolation features, and not all of them are illustrated. The isolation feature 221 defines a pixel region 211 and a periphery region 212 of the semiconductor substrate 210. In some embodiments, the isolation features 221 and 222 include material such as silicon oxide, a trench isolation, silicon dioxide or field oxide (FOX). In some embodiments, the isolation features 221 and 222 may be shallow trench isolations (STIs) used to separate and isolate photo diodes, memory cells or SRAM cells in an array area. Some of the isolation features 221 and 222 may be deep trench isolations used to separate and isolate NMOS and PMOS devices in a peripheral area, and some of the isolation features 221 and 222 may be junction isolations to isolate active elements. The structures, materials, depth of the STI and the deep trench isolations can be different in different areas. Specific STI profile and material may be needed for meeting certain device requirements.

Figure 2B:
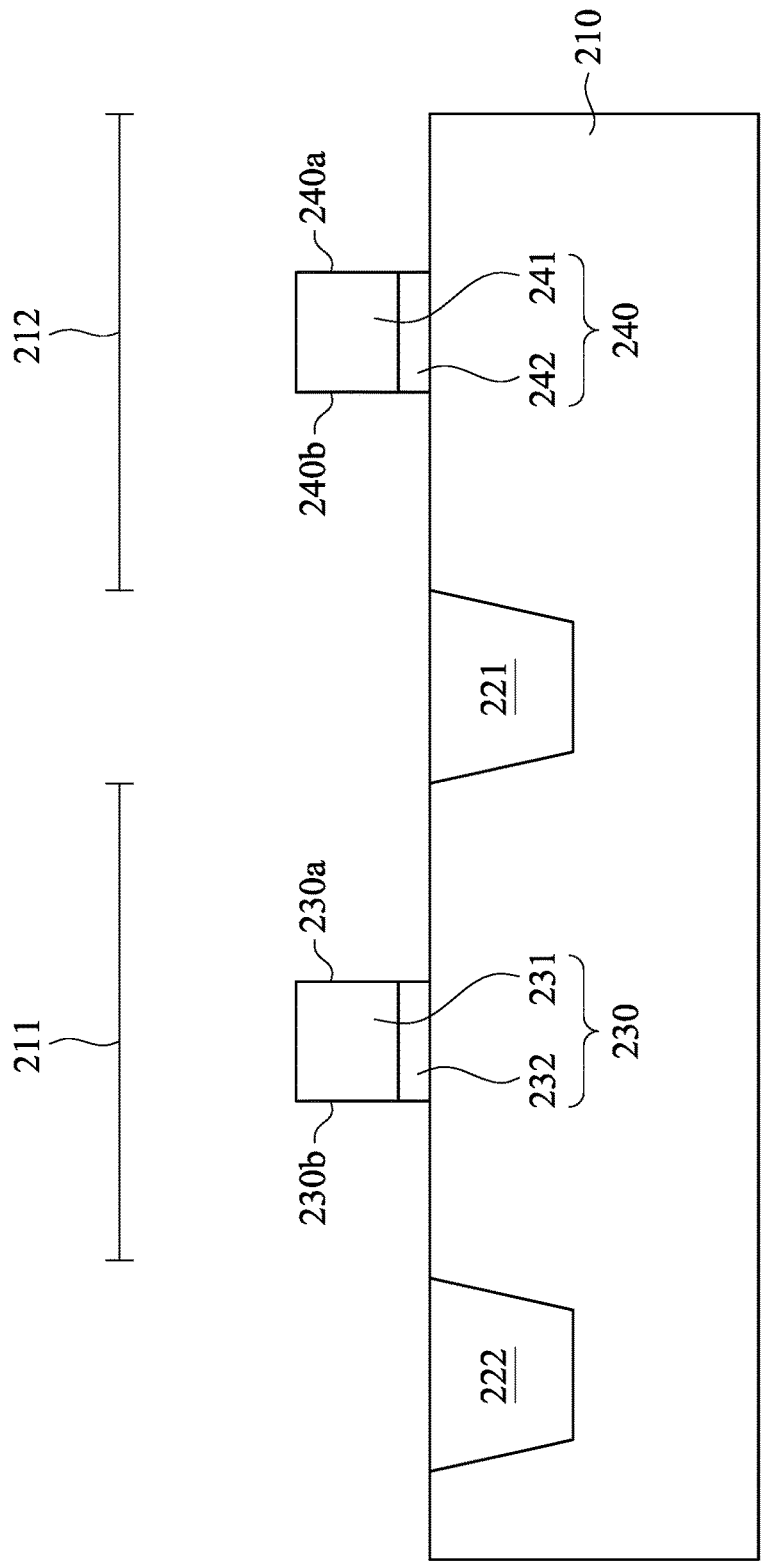

Referring to FIG. 2B, a transistor gate 230 (such as a transfer transistor or a reset transistor) is disposed on the semiconductor substrate 210 in the pixel region 211, and a gate structure 240 is disposed on the semiconductor substrate 210 in the periphery region 212. In some embodiments, the transistor gate 230 includes a poly-silicon gate 231 and a dielectric layer 232, and the gate structure 240 includes a poly-silicon gate 241 and a dielectric layer 242. Therefore, the poly-silicon gates 231 and 241 may be formed in the same operation, and it is similar to the operation of forming the dielectric layers 232 and 242. In some embodiments, the dielectric layers 232 and 242, such as silicon dioxide, are thermally grown to a thickness between about 10 Å to about 150 Å. The poly-silicon gates 231 and 241 are next deposited via LPCVD process, procedures to a thickness in a range from about 1000 Å to about 3000 Å. The poly-silicon gates 231 and 241 can be doped in situ, during deposition, via the addition of arsine, or phosphine, to a silane ambient, or the poly-silicon gates 231 and 241 can be deposited intrinsically, and subsequently doped via implantation of arsenic or phosphorous ions. The transistor gate 230 has a first sidewall 230a and a second sidewall 230b opposite to the first sidewall 230a. The gate structure 240 has a first sidewall 240a and a second sidewall 240b opposite to the first sidewall 240a.

Figure 2C:
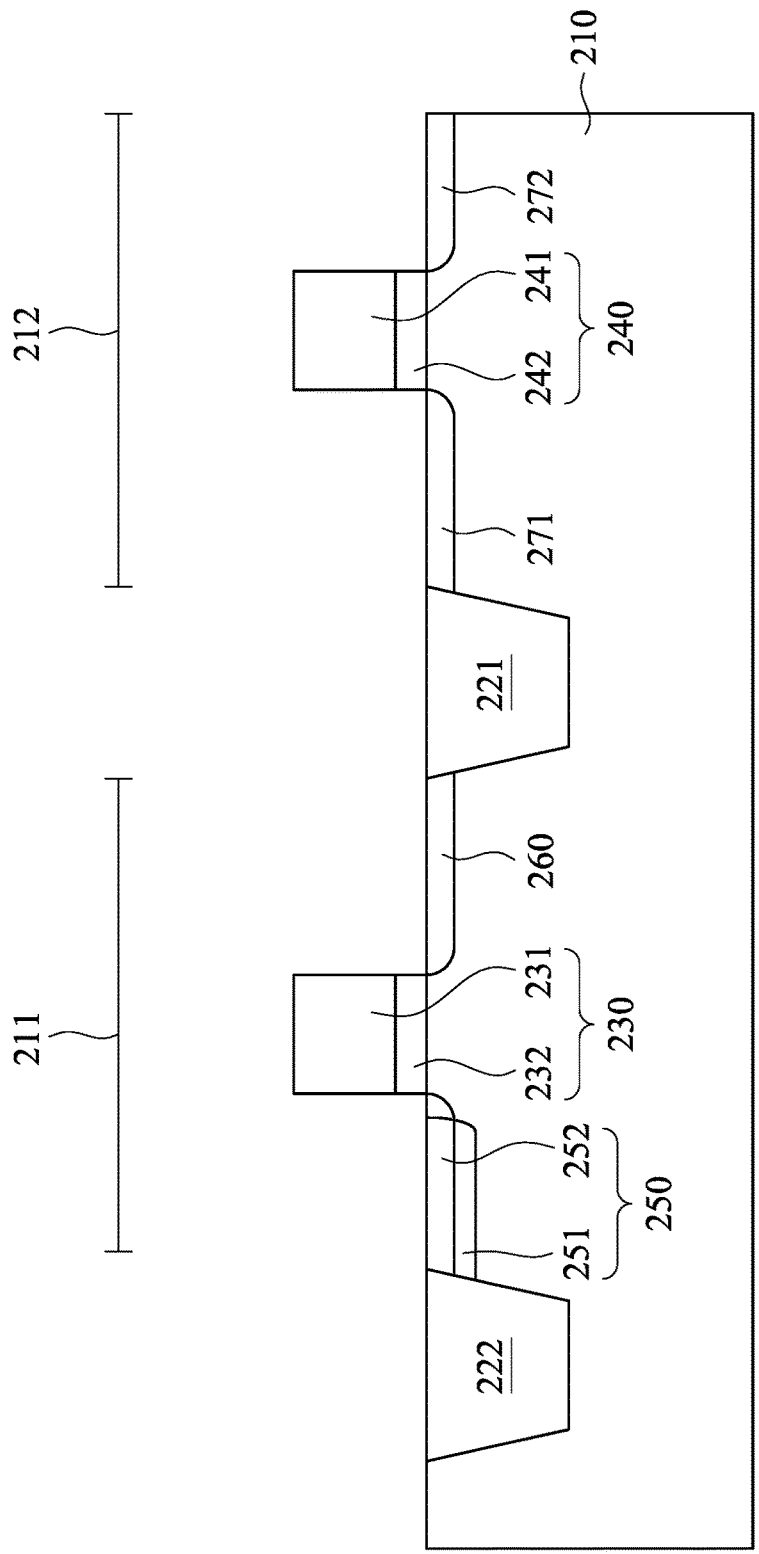

Referring to FIG. 2C, a first PPD 251 with a first dopant type is formed in the pixel region 211, a first-type drain region 260 is formed in the pixel region 211, and a first-type source region 271 and a first-type drain region 272 are formed in the periphery region 212 by doping first-type ions (such as phosphorus or arsenic) into the pixel region 211 and the periphery region 212 of the semiconductor substrate 210 (such as a p-type semiconductor substrate). Then, a second PPD 252, such as a p-type pinned photodiode (PPPD), is formed and embedded in the first PPD 251 by implanting p-type doping ions (such boron or gallium) into in a portion of the first PPD 251. The first PPD 251 and the second PPD 252 form a photodiode 250, in which a P-N junction is used for transforming photons into electrons. The photodiode 250 is adjacent to the second sidewall 230b of the transistor gate 230 and is adjacent to the isolation feature 222. The transistor gate 230 is between the photodiode 250 and the first-type drain region 260, and the gate structure 240 is between the first-type source region 271 and the first-type drain region 272.

Figure 2D:
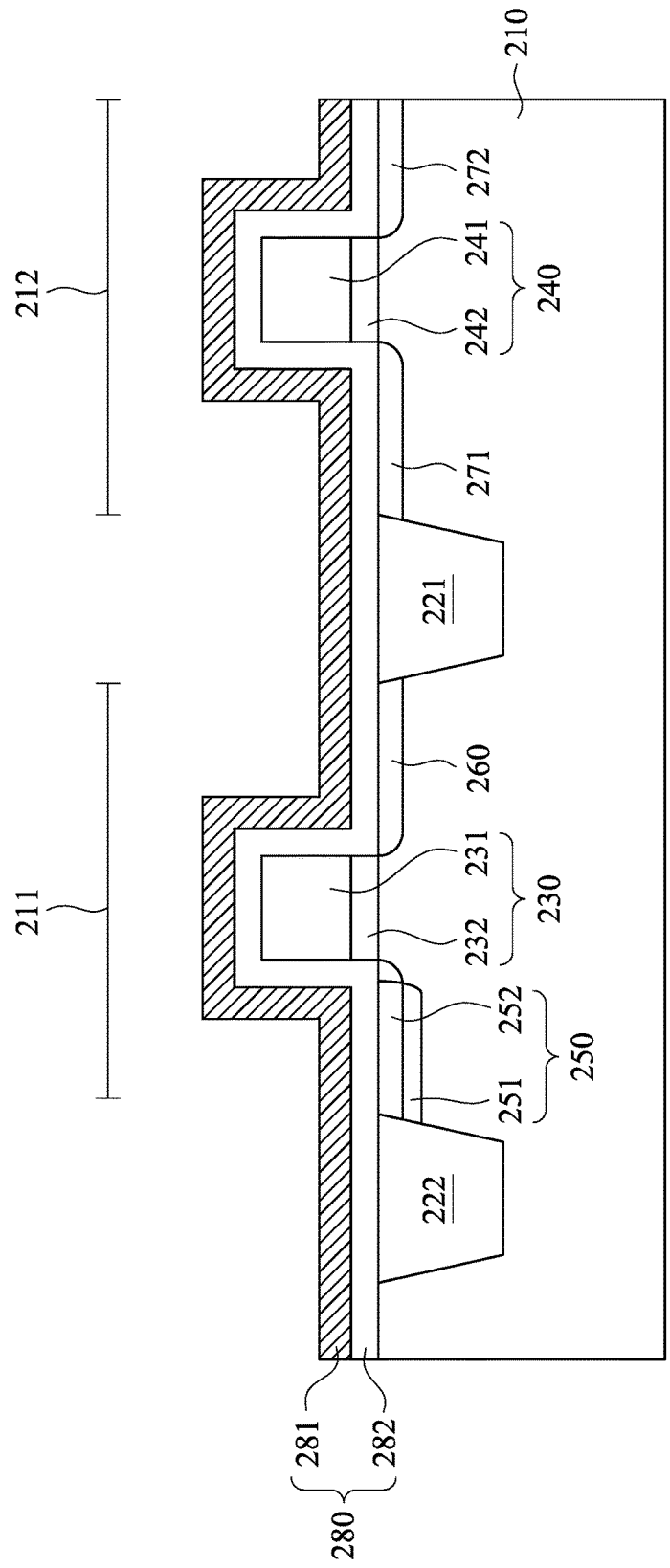

Referring to FIG. 2D, a silicon nitride layer 182 and a silicon dioxide layer 181 are deposited on the isolation feature 221, 222, the photodiode 250, the transistor gate 230, the gate structure 240, the first-type drain region 260, the first-type source region 271 and the first-type drain region 272 by using a rapid process oxidation process, a low pressure chemical vapor deposition (LPCVD) or a plasma enhanced chemical vapor deposition (PECVD) process. The silicon nitride layer 182 and the silicon dioxide layer 181 form a spacer layer 280, in which the silicon nitride layer 282 is disposed between the silicon dioxide layer 281 and the semiconductor substrate 210.

Figure 2E:
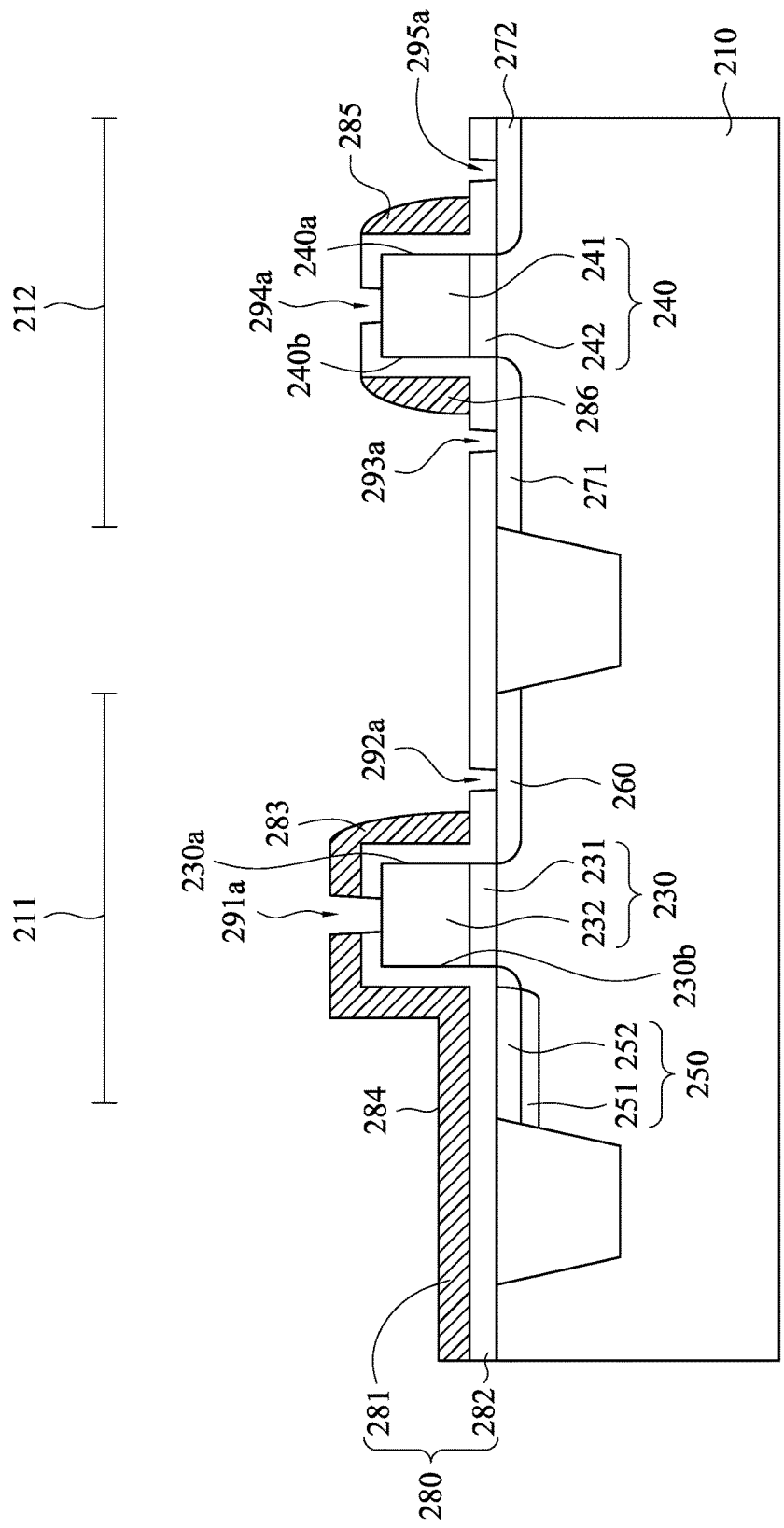

Referring to FIG. 2E, one or more photoresist are used, and the spacer layer 280 is etched to form a protective structure 284 covering the photodiode 250 and a top surface of the transistor gate 230, a sidewall spacer 283 on the first sidewall 230a, a sidewall spacer 286 on the sidewall 240b, and a sidewall spacer 285 on the sidewall 240a. The spacer layer 280 is also etched to have openings 291a-295a corresponding to the transistor gate 230, the first-type drain region 260, the first-type source region 271, the gate structure 240, and the first-type drain region 272 respectively. Note that the portion of the silicon dioxide layer 281 above the photodiode 250 is not etched to form the protective structure 284, and therefore the photodiode 250 is protected from being damaged by subsequent processes. Also note that there are two sidewall spacers 285 and 286 on the gate structure 240, but only one sidewall spacer 283 is formed on the transistor gate 230. In other embodiments, the spacer layer 280 may include a nitride-oxide-nitride layer or other suitable dielectric layer, and the portion of the dielectric layer above the photodiode 250 is not etched.

Figure 2F:
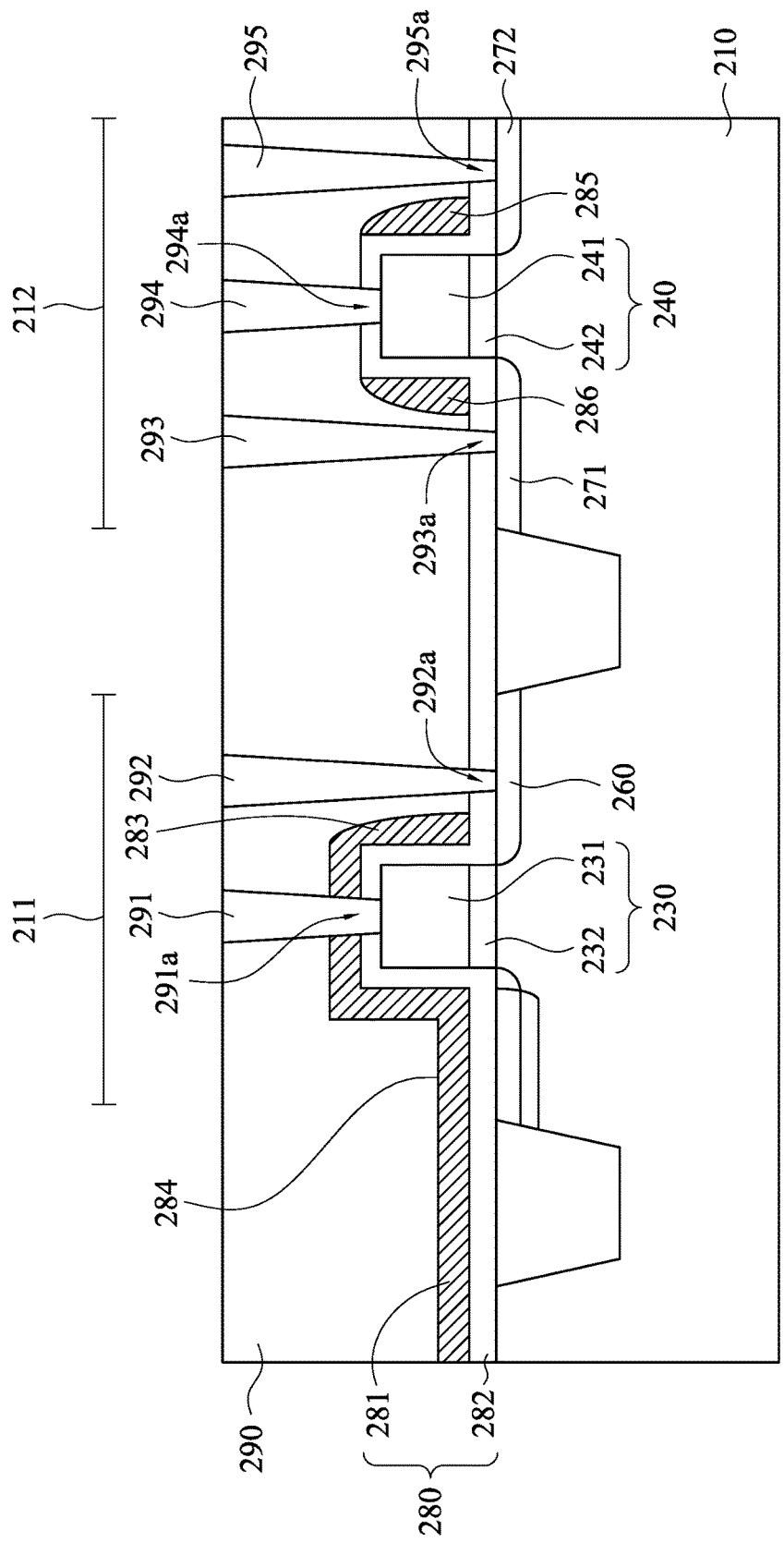

Referring to FIG. 2F, an inter layer dielectric (ILD) layer 290, such as formed from silicon oxide or borophosphosilicate glass (BPSG), is deposited to have a thickness in a range from about 300 nm to about 1300 nm using such as a low pressure chemical vapor deposition (LPCVD) process or a plasma enhanced chemical vapor deposition (PECVD) process. Then, a chemical mechanical polishing (CMP) procedure is used for planarization, thereby creating a smooth top surface topography for the ILD layer. Photolithographic and RIE processes, such as using $CHF_3$ as an etchant, may be used to form contact holes in the ILD layer 290. Then, a metal material, such as formed from tungsten, aluminum, or copper, fills the contact holes to form the contact structures 291-295 which are electrically connected to the transistor gate 230, the first-type drain region 260, the first-type source region 271, the gate structure 240, and the first-type drain region 272 through the openings 291a-295a respectively.

Figure 3:
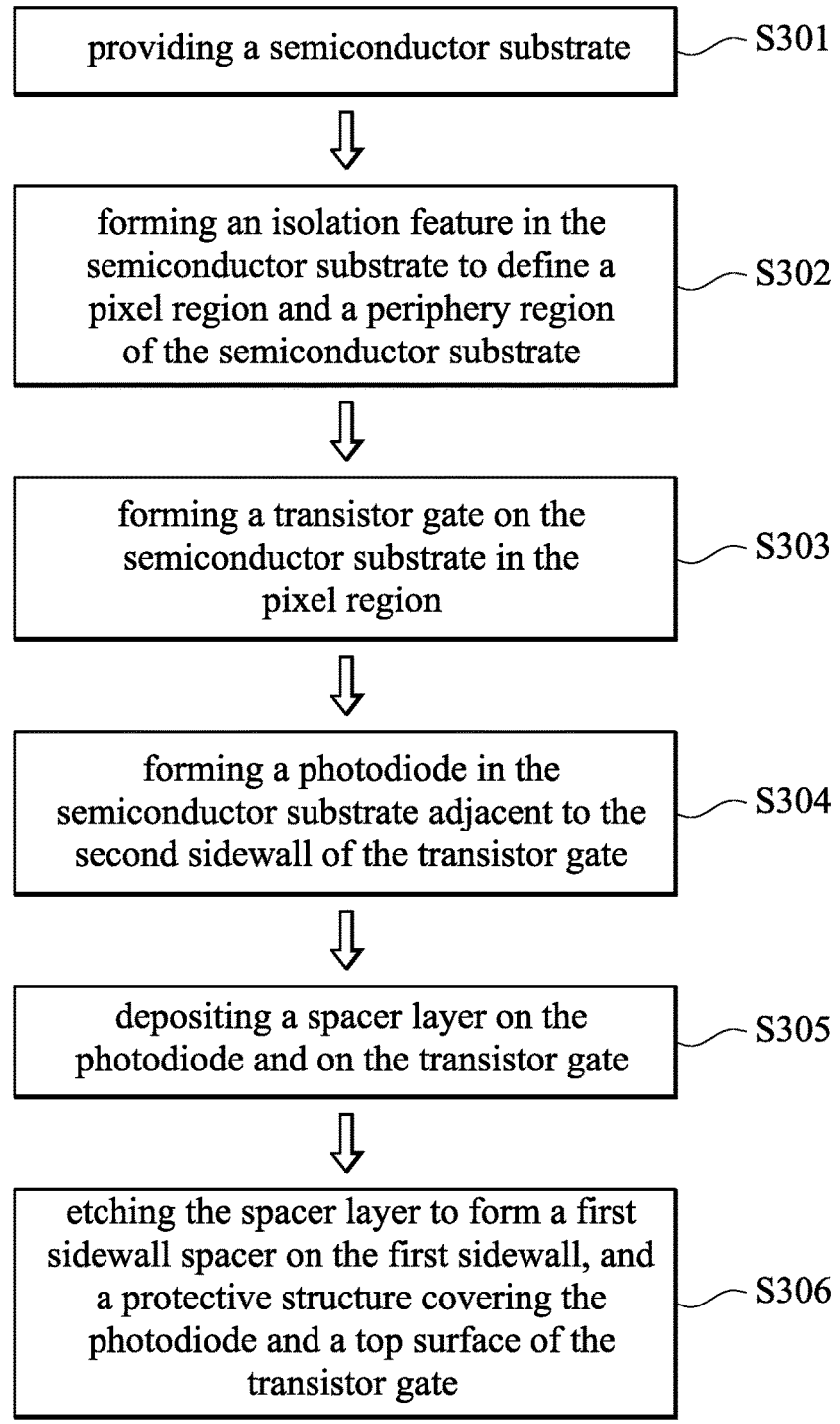
FIG. 3 is a flow chart of a method for fabricating a semiconductor device according to some embodiments.

FIG. 3 is a flow chart of a method for fabricating a semiconductor device according to some embodiments. Referring to FIG. 3 together with FIG. 2A-FIG. 2F, at operation S301, a semiconductor substrate 210 is provided. At operation S302, an isolation feature 221 is formed in the semiconductor substrate 210 to define a pixel region 211 and a periphery region 212 of the semiconductor substrate 210. At operation S303, a transistor gate 230 is formed on the semiconductor substrate 210 in the pixel region 211. At operation S304, a photodiode 250 is formed in the semiconductor substrate 210, in which the photodiode 250 is adjacent to the second sidewall 230b of the transistor gate 230. At operation S305, a spacer layer 280 is deposited on the photodiode 250 and on the transistor gate 230. At operation S306, the spacer layer 280 is etched to form a first sidewall spacer 283 on the first sidewall 230a of the transistor gate 230, and a protective structure 284 covering the photodiode 250 and a top surface of the transistor gate 230.

Figure 4:
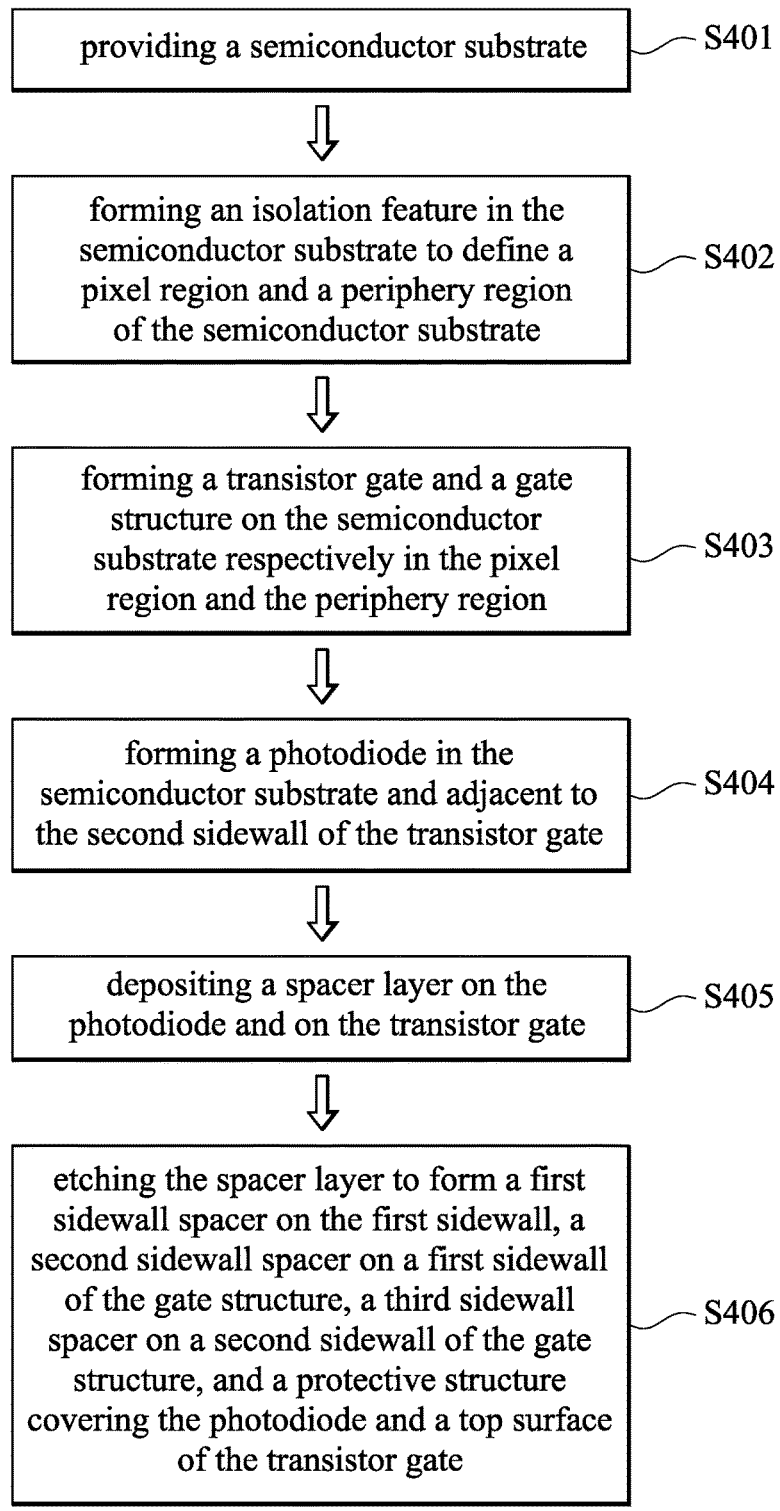
FIG. 4 is a flow chart of a method for fabricating a semiconductor device according to some embodiments.

FIG. 4 is a flow chart of a method for fabricating a semiconductor device according to some embodiments. Referring to FIG. 4 together with FIG. 2A-FIG. 2F, at operation S401, a semiconductor substrate 210 is provided. At operation S402, an isolation feature 221 is formed in the semiconductor substrate 210 to define a pixel region 211 and a periphery region 212 of the semiconductor substrate 210. At operation S403, a transistor gate 230 and a gate structure 240 are formed on the semiconductor substrate 210 respectively in the pixel region 211 and the periphery region 212. At operation S304, a photodiode 250 is formed in the semiconductor substrate 210, in which the photodiode 250 is adjacent to the second sidewall 230b of the transistor gate 230. At operation S305, a spacer layer 280 is deposited on the photodiode 250 and on the transistor gate 230. At operation S306, the spacer layer 280 is etched to form a first sidewall spacer 283 on the first sidewall 230a, a second sidewall spacer 285 on the first sidewall 240a of the gate structure 240, a third sidewall spacer 286 on a second sidewall 240b of the gate structure 240, and a protective structure 284 covering the photodiode 250 and a top surface of the transistor gate 230.

In accordance with embodiments, the present disclosure discloses a semiconductor device. The semiconductor device includes a semiconductor substrate. An isolation feature is disposed in the semiconductor substrate to define a pixel region and a periphery region of the semiconductor substrate. A transistor gate is formed on the semiconductor substrate in the pixel region, in which the transistor gate has a first sidewall and a second sidewall opposite to the first sidewall. A photodiode is disposed in the semiconductor substrate and is adjacent to the second sidewall of the transistor gate. A patterned spacer layer is formed on the photodiode and on the transistor gate. The patterned spacer layer includes a first sidewall spacer on the first sidewall of the transistor gate, and a protective structure covering the photodiode and a top surface of the transistor gate.

In accordance with embodiments, the present disclosure discloses a method for fabricating a semiconductor device. In the method, a semiconductor substrate is provided. An isolation feature is formed in the semiconductor substrate to define a pixel region and a periphery region of the semiconductor substrate. A transistor gate is formed on the semiconductor substrate in the pixel region. A photodiode is formed in the semiconductor substrate adjacent to the second sidewall of the transistor gate. A spacer layer is deposited on the photodiode and on the transistor gate. The spacer layer is etched to form a first sidewall spacer on the first sidewall of the transistor gate, and a protective structure covering the photodiode and a top surface of the transistor gate.

In accordance with embodiments, the present disclosure discloses a method for fabricating a semiconductor device. In the method, a semiconductor substrate is provided. An isolation feature is formed in the semiconductor substrate to define a pixel region and a periphery region of the semiconductor substrate. A transistor gate and a gate structure are formed on the semiconductor substrate respectively in the pixel region and the periphery region. A photodiode is formed in the semiconductor substrate adjacent to a second sidewall of the transistor gate. A spacer layer is deposited on the photodiode and on the transistor gate. The spacer layer is etched to form a first sidewall spacer on the first sidewall of the transistor gate, a second sidewall spacer on a first sidewall of the gate structure, a third sidewall spacer on a second sidewall of the gate structure, and a protective structure covering the photodiode and a top surface of the transistor gate.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating a semiconductor device, the method comprising:
    providing a semiconductor substrate;
    forming an isolation feature in the semiconductor substrate to define a pixel region and a periphery region of the semiconductor substrate;
    forming a transistor gate on the semiconductor substrate in the pixel region and a gate structure on the semiconductor substrate in the periphery region, wherein the transistor gate has a first sidewall and a second sidewall opposite to the first sidewall of the transistor gate;
    forming a photodiode in the semiconductor substrate, wherein the photodiode is adjacent to the second sidewall of the transistor gate;
    depositing a spacer layer on the photodiode and on the transistor gate; and
    etching the spacer layer to form a first sidewall spacer on the first sidewall, and a protective structure covering the photodiode and a top surface of the transistor gate, wherein the patterned spacer layer comprises a silicon nitride layer and a silicon dioxide layer, the silicon nitride layer is disposed between the silicon dioxide layer and the semiconductor substrate, and the silicon nitride layer is in direct contact with the photodiode, wherein the silicon nitride layer and the silicon dioxide layer cover the transistor gate, the silicon nitride layer covers the gate structure, and the silicon dioxide layer does not cover the gate structure.

2. The method of claim 1, wherein the gate structure has a first sidewall and a second sidewall opposite to the first sidewall of the gate structure.

3. The method of claim 2, wherein the process of etching the spacer layer further comprises:
    etching the patterned spacer layer to form a second sidewall spacer on the first sidewall of the gate structure, and a third sidewall spacer on the second sidewall of the gate structure.

4. The method of claim 1, wherein the first sidewall spacer and the protective structure belong to the silicon dioxide layer.

5. The method of claim 1, wherein the process of etching the spacer layer further comprises:
    etching the patterned spacer layer to have an opening corresponding to the transistor gate, and the opening is surrounded by a remaining portion of the patterned spacer layer.

6. The method of claim 5, further comprising:
    forming a contact structure electrically connected to the transistor gate through the opening.

7. The method of claim 1, wherein the photodiode comprises a first pinned photodiode with a first dopant type, and a second pinned photodiode with a second dopant type, wherein the second dopant type is different from the first dopant type.

8. A method for fabricating a semiconductor device, the method comprising:
    providing a semiconductor substrate;
    forming an isolation feature in the semiconductor substrate to define a pixel region and a periphery region of the semiconductor substrate;
    forming a transistor gate and a gate structure on the semiconductor substrate respectively in the pixel region and the periphery region, wherein the transistor gate has a first sidewall and a second sidewall opposite to the first sidewall of the transistor gate;
    forming a photodiode in the semiconductor substrate, wherein the photodiode is adjacent to the second sidewall of the transistor gate;
    depositing a spacer layer on the photodiode and on the transistor gate; and
    etching the spacer layer to form a first sidewall spacer on the first sidewall of the transistor gate, a second sidewall spacer on a first sidewall of the gate structure, a third sidewall spacer on a second sidewall of the gate structure, and a protective structure covering the photodiode and a top surface of the transistor gate, wherein the patterned spacer layer comprises a silicon nitride layer and a silicon dioxide layer, the silicon nitride layer is disposed between the silicon dioxide layer and the semiconductor substrate, and the silicon nitride layer is in direct contact with the photodiode, wherein the silicon nitride layer and the silicon dioxide layer cover the transistor gate, the silicon nitride layer covers the gate structure, and the silicon dioxide layer does not cover the gate structure.

9. The method of claim 8 wherein the first sidewall spacer, the second sidewall spacer, the third sidewall spacer and the protective structure belong to the silicon dioxide layer.

10. The method of claim 8, wherein the process of etching the spacer layer further comprises:
etching the patterned spacer layer to have an opening corresponding to the transistor gate, and the opening is surrounded by a remaining portion of the patterned spacer layer.

11. The method of claim 10, further comprising:
forming a contact structure electrically connected to the transistor gate through the opening.

12. The method of claim 1, wherein the protective structure also covers the second sidewall of the transistor gate.

13. The method of claim 1, wherein the silicon nitride layer covers the isolation feature.

14. The method of claim 1, wherein the photodiode is adjacent to a second isolation feature.

15. The method of claim 8, wherein the protective structure also covers the second sidewall of the transistor gate.

16. The method of claim 8, wherein the silicon nitride layer covers the isolation feature, and the silicon dioxide layer does not cover the isolation feature.

17. The method of claim 8, wherein the photodiode is adjacent to a second isolation feature.

18. The method of claim 8, wherein the photodiode comprises a first pinned photodiode with a first dopant type, and a second pinned photodiode with a second dopant type, wherein the second dopant type is different from the first dopant type.

19. The method of claim 4, wherein the second sidewall spacer and the third sidewall spacer belong to the silicon dioxide layer.

20. The method of claim 13, wherein the silicon dioxide layer does not cover the isolation feature.

* * * * *